United States Patent
Muronoi et al.

(10) Patent No.: US 11,202,373 B2
(45) Date of Patent: Dec. 14, 2021

(54) CONNECTOR DEVICE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Yu Muronoi, Mie (JP); Naomichi Kawashima, Mie (JP); Tatsuo Hirabayashi, Mie (JP); Seiji Hashimoto, Toyota (JP); Iori Kobayashi, Toyota (JP); Yoshiaki Kado, Toyota (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/816,956

(22) Filed: Mar. 12, 2020

(65) Prior Publication Data
US 2020/0315026 A1   Oct. 1, 2020

(30) Foreign Application Priority Data
Mar. 28, 2019   (JP) .............................. JP2019-063790

(51) Int. Cl.
*H05K 7/00* (2006.01)
*H05K 3/28* (2006.01)
*H05K 5/00* (2006.01)
*H01R 12/57* (2011.01)
*H01R 12/71* (2011.01)
*H05K 5/06* (2006.01)

(52) U.S. Cl.
CPC ............. *H05K 3/284* (2013.01); *H01R 12/57* (2013.01); *H01R 12/712* (2013.01); *H05K 5/0034* (2013.01); *H05K 5/065* (2013.01); *H05K 2203/1316* (2013.01)

(58) Field of Classification Search
CPC ...... H05K 3/284; H05K 5/0034; H05K 5/065; H01R 12/57; H01R 12/712
USPC .................................................. 361/761, 760
See application file for complete search history.

(56) References Cited

U.S. PATENT DOCUMENTS

2017/0117071 A1* 4/2017 Wakabayashi ......... H01B 3/441

FOREIGN PATENT DOCUMENTS

| JP | 2006-328993 A | 12/2006 |
| JP | 2019/039244 | * 2/2019 |

* cited by examiner

*Primary Examiner* — Andargie M Aychillhum
(74) *Attorney, Agent, or Firm* — Oliff PLC

(57) ABSTRACT

A connector device that includes a circuit board; a connector attached to the circuit board; and a molded resin that covers the entire circuit board and part of the connector, wherein: a housing of the connector contains a resin material and fibrous inorganic fillers, a groove is formed in a region of a surface of the housing that is covered with the molded resin, the groove being formed by removing the resin material with the inorganic fillers remaining, and extending in a direction that intersects a mounting direction in which a counterpart connector is to be mounted to the connector, the groove has a depth and a width in a range from 50 μm to 150 μm inclusive, and the groove is filled with the molded resin.

7 Claims, 11 Drawing Sheets

CONNECTOR DEVICE

BACKGROUND

The present disclosure relates to a connector device.

Connectors whose terminals are provided within a resin housing are used to wire various electronic control parts to a control device, for example. There are also cases where a circuit board that constitutes a control device is disposed inside a cover of a machine part or the like on which various electronic control parts are provided, and a connector for wiring this circuit board to the electronic control parts or another control device is provided on the circuit board or the cover. A connector device is an integration of a circuit board disposed inside a resin cover or within a molded resin and a connector, and is used while being attached to a machine part or the like. The connector device may also be referred to as a substrate connector.

In some conventional connector devices, a circuit board is covered by two divided covers, and a waterproof sealing material is placed in the gap between the covers. Such connector devices of this cover type have a problem in that forming and assembling the covers and the sealing material take time, and the manufacturing process is complicated. The connector devices of this cover type also have a problem in that the covers have a large outer shape in order to cover the circuit board, leading to an increase in the size of the connector devices.

On the other hand, there are also molded-type connector devices in which a circuit board and part of a connector are disposed within a molded resin formed through molding, and the remaining part of the connector protrudes from the molded resin. In such a molded-type connector device, the waterproofing performance is ensured since the circuit board is covered with the molded resin, so that conventional covers and sealing material can be omitted. Furthermore, in the molded-type connector device, manufacturing processes such as forming and assembling are facilitated due to molding, and the connector device is downsized due to not using a cover. An example of the molded-type connector devices is disclosed, for example, in JP 2006-328993A.

SUMMARY

However, as a result of the study of the waterproofing performance (water stopping properties) of a molded-type connector device by the inventors of the present application, it turned out that water may enter a molded resin from a space between a housing of a connector and the molded resin. Accordingly, further elaboration is required to prevent water from entering the connector device from the space between the housing and the molded resin.

An exemplary aspect of the disclosure realizes a connector device that has improved waterproofing performance between a housing of a connector and a molded resin.

According to one aspect of the present disclosure, a connector device includes: a circuit board; a connector attached to the circuit board; and a molded resin that covers the entire circuit board and part of the connector, wherein a housing of the connector contains a resin material and fibrous inorganic fillers, a groove is formed in a region of a surface of the housing that is covered with the molded resin, the groove being formed by removing the resin material with the inorganic fillers remaining, and extending in a direction that intersects a mounting direction in which a counterpart connector is to be mounted to the connector, the groove has a depth and a width in a range from 50 μm to 150 μm inclusive, and the groove is filled with the molded resin.

According to the connector device of the one aspect, it is possible to improve the waterproofing performance between the housing of the connector and the molded resin.

DETAILED DESCRIPTION OF EMBODIMENTS

Figure 1:
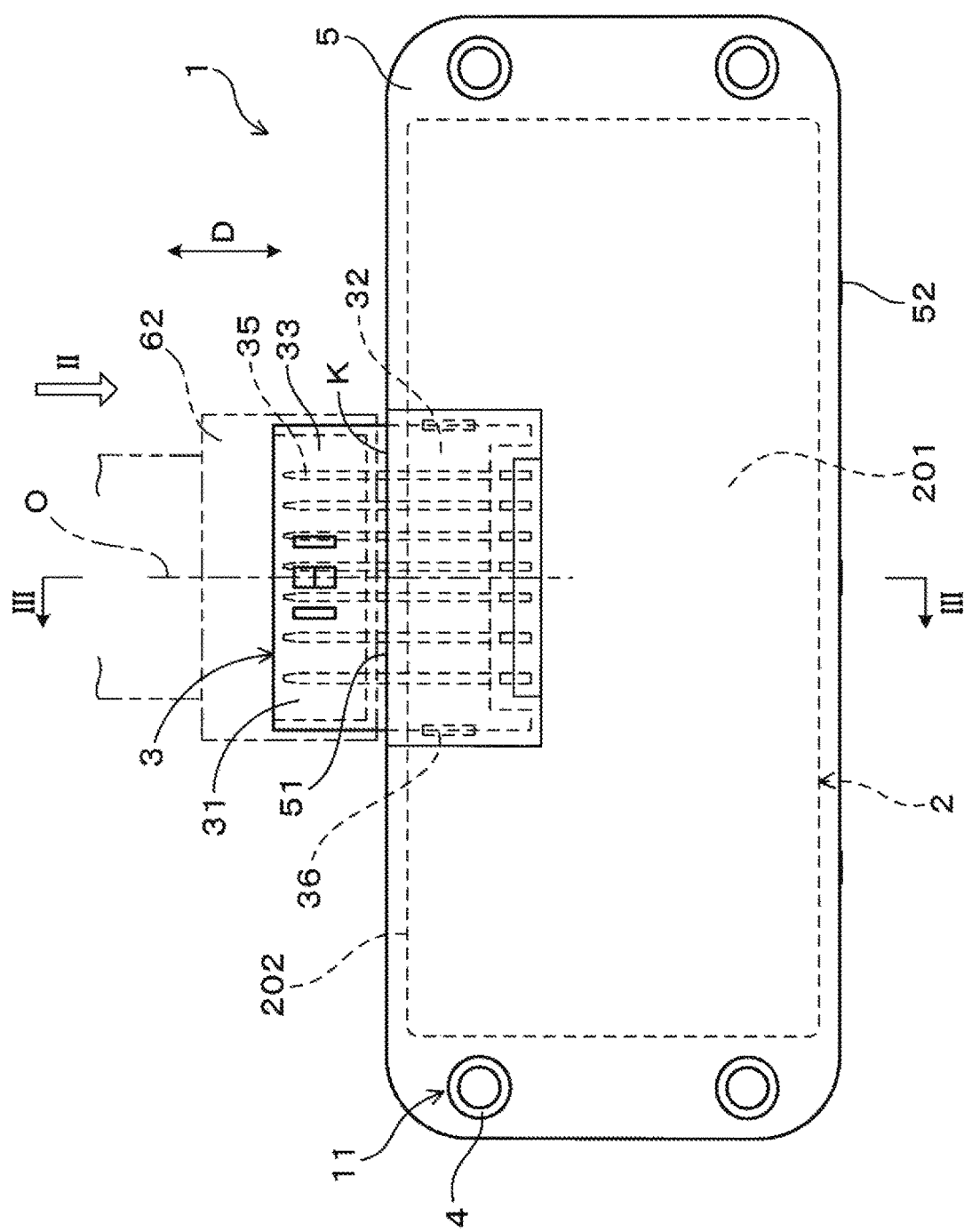
FIG. 1 is a plan view illustrating a connector device according to an embodiment.

Description of Embodiments of the Present Disclosure

First, embodiments of the present disclosure will be described in series.

(1) According to one aspect of the present disclosure, a connector device includes:

a circuit board;

a connector attached to the circuit board; and a molded resin that covers the entire circuit board and part of the connector, wherein a housing of the connector contains a resin material and fibrous inorganic fillers, a groove portion is formed in a region of a surface of the housing that is covered with the molded resin, the groove portion being formed by removing the resin material with the inorganic fillers remaining, and extending in a direction that intersects a mounting direction in which a counterpart connector is to be mounted to the connector, the groove portion has a depth and a width in a range from 50 μm to 150 μm inclusive, and the groove portion is filled with the molded resin.

Functional Effects

The connector device of the one aspect is of a molded-type in which the entire circuit board and part of the connector are covered with the molded resin. Also, in this connector device, the material for the housing of the connector and the shape of an interface between the housing and the molded resin are improved to enhance the waterproofing performance of the connector device.

In the connector device, the entire circuit board is covered with the molded resin, and thus the circuit board can be protected from water by the molded resin. Also, the interface between the housing of the connector and the molded resin is located on the surface of the connector device. This interface is a region of the connector device that needs a countermeasure against water the most.

The surface of the holding portion of the housing of the connector has the groove portion that extends in a direction that intersects the mounting direction in which a counterpart connector is to be mounted. The inorganic fillers remain in this groove portion. Also, in the state in which the groove portion is filled with the molded resin, an anchor effect can be achieved that the molded resin is less likely to be removed due to being caught on the inorganic fillers in the groove portion.

Accordingly, the degree of areal contact or adhesion strength between the housing and the molded resin increases, so that the housing and the molded resin at the interface are less likely to be uncoupled. Therefore, the waterproofing performance between the housing of the connector and the molded resin can be improved, making it possible to prevent water from entering the connector device connector from the interface between the housing and the molded resin.

A thermoplastic resin may be used as the resin material for the housing of the connector. In addition to glass fibers, various insulating and heat-resisting fiber materials may be used as the fibrous inorganic fillers that constitute the housing. It is assumed that the molded resin is formed through molding. Examples of the molding include melt molding such as hot melt molding, as well as injection molding.

If the depth and the width of the groove portion are less than 50 μm, the groove portion is small, and it is difficult to prevent water from entering the connector device from the interface between the housing of the connector and the molded resin. On the other hand, if the depth and the width of the groove portion exceed 150 μm, the groove portion is large, and it is difficult to process the groove portion using laser beams.

The groove portion formed in the housing can be formed by irradiating the housing with laser beams to remove the resin material therefrom. In this case, the depth and the width of the resin material that is removed by being irradiated with laser beams serve as the depth and the width of the groove portion. Laser beams are directional (straight moving) and convergent light, and are suited to remove the resin material in the target region of the housing in a short time and with accuracy.

(2) According to the connector device of the one aspect, a leading end portion of the region of the molded resin that covers the housing may be arranged in a direction orthogonal to a central axis line of the housing that is parallel to the mounting direction and extends through the center of the connector, and the groove portion may be formed in a region of the housing on a base side of the leading end portion of the molded resin, the groove portion being formed in parallel to the leading end portion. With this configuration, the groove portion and the molded resin arranged in the groove portion can stop water from entering the connector device from the leading end portion of the molded resin. Thus, it is possible to effectively prevent water from entering the connector device.

(3) The leading end portion of the molded resin may be arranged over the entire periphery around the central axis line of the housing, and the groove portion may be formed in the region of the housing on a base side of the leading end portion of the molded resin, the groove portion being formed over the entire periphery around the central axis line. With this configuration, it is possible to effectively prevent water from entering the connector device from the leading end portion of the molded resin over the entire periphery of the housing.

(4) One or more groove portions may be formed in parallel to the leading end portion of the molded resin. If a plurality of groove portions are formed in parallel to the leading end portion of the molded resin, it is possible to effectively prevent water from entering the connector device from the leading end portion of the molded resin.

(5) The inorganic fillers may be made of glass fibers, and a plurality of inorganic fillers, out of the inorganic fillers arranged in the groove portion, may be directed in different directions. With the use of glass fibers as the inorganic fillers, the inorganic fillers can be likely to remain in a groove portion when the groove portion is formed.

(6) The molded resin may have a gate mark that indicates that the molded resin is formed through molding. With this configuration, it is possible to confirm that the molded resin of the connector device is formed through molding.

(7) A region of the molded resin that faces a plate of the circuit board preferably have a thickness in a range from 1 mm to 5 mm inclusive. With this configuration, it is possible to reduce the thickness of the molded resin while maintaining the strength of the molded resin.

(8) The connector device is used as an on-board control unit. The on-board control unit is also referred to as an electronic control unit. The connector device, when installed in a vehicle and is used, is protected from water when the vehicle is exposed to water.

(9) The molded resin may serve as the outer-most cover that is exposed to air. With this configuration, it is possible to downsize the connector device. Furthermore, water contained in the air can be prevented from entering the interface between the housing of the connector and the molded resin.

(10) The molded resin may include a attaching portion that is used to attach the connector device to an external device, and the attaching portion may have a metal collar through which a bolt is inserted. With this configuration, it is possible to attach the connector device to an external machine part or the like, using the bolt inserted into the collar.

DETAILS OF EMBODIMENTS OF THE PRESENT DISCLOSURE

An embodiment of the connector device of the present disclosure will be described with reference to the drawings.

Embodiment

Figure 2:
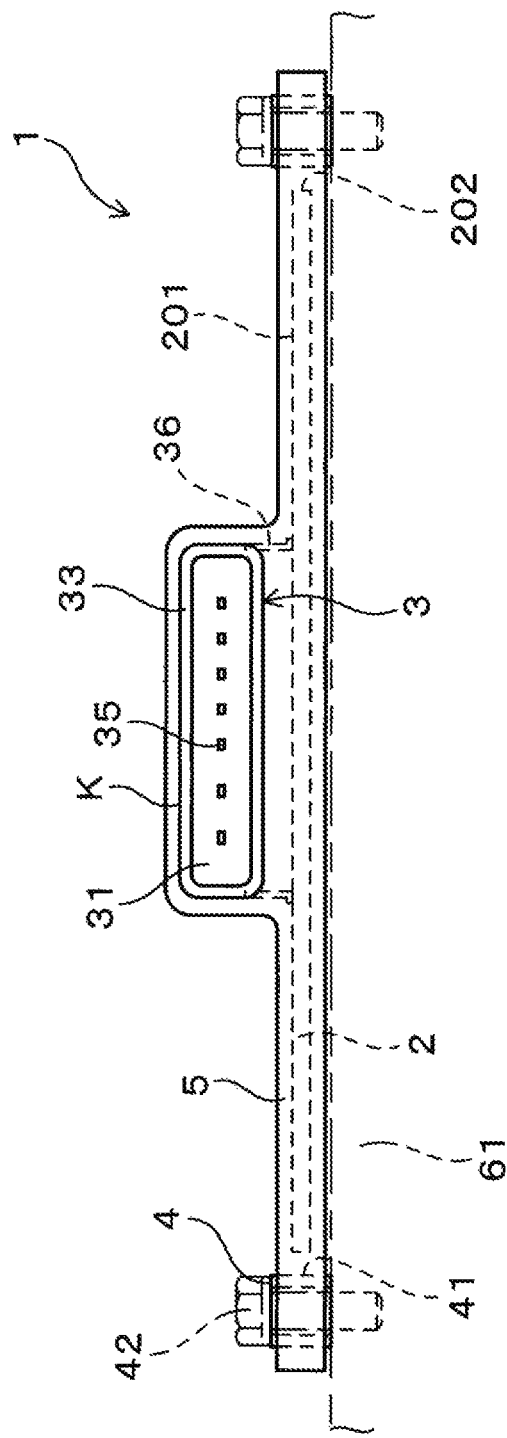
FIG. 2 is a diagram as viewed from the perspective of an arrow II in FIG. 1, illustrating the connector device according to the embodiment.
Figure 3:
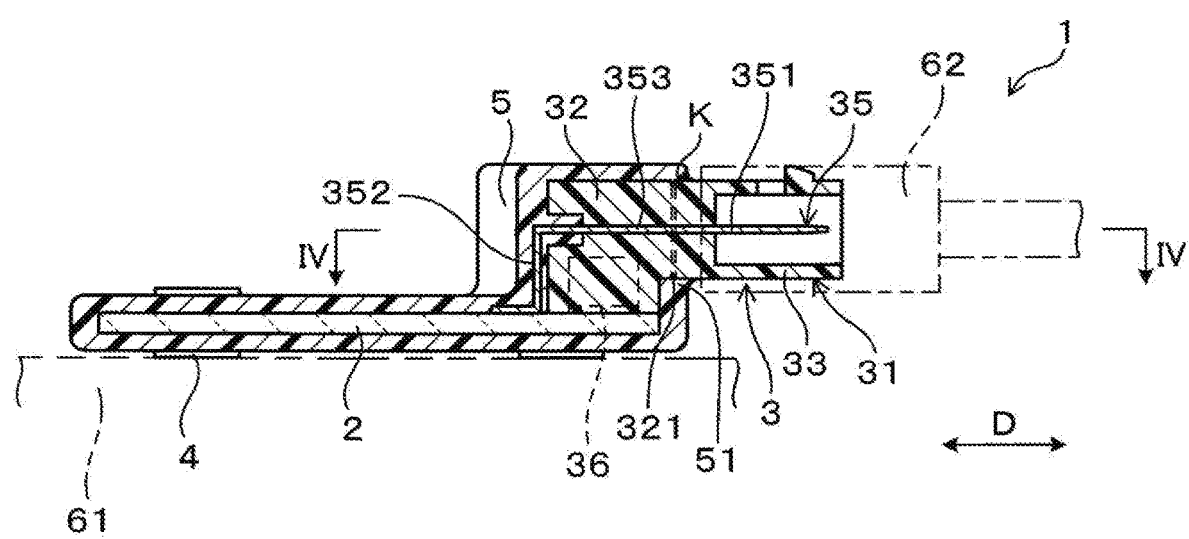
FIG. 3 is a cross-sectional view taken along a line III-III in FIG. 1, illustrating the connector device according to the embodiment.

As shown in FIGS. 1 to 3, a connector device 1 according to the present embodiment is provided with a circuit board 2, a connector 3 mounted to the circuit board 2, and a molded resin 5 that covers the entire circuit board 2 and part of the connector 3. As shown in FIGS. 4 to 7, a housing 31 of the connector 3 includes a resin material 301 and fibrous inorganic fillers 302. A groove portion 321 (groove) is formed in a region of the surface of the housing 31 that is covered with the molded resin 5, the groove portion 321 being formed by removing the resin material 301 with the inorganic fillers 302 remaining, and extending in a direction that intersects a direction D in which a counterpart connector 62 is mounted to the connector 3. The groove portion 321 has a depth h1 and a width w1 in a range from 50 µm and 150 µm inclusive. The groove portion 321 is filled with the molded resin 5.

The following will describe the connector device 1 of the present embodiment in detail.

Connector Device 1

As shown in FIGS. 1 to 3, the connector device 1, serving as an on-board control unit, is used as a control device for a machine part 61 installed in a vehicle. The connector device 1 is used while being attached to the machine part 61 or the like. The circuit board 2 of the connector device 1 is configured to control various types of electronic control parts of the machine part 61. Examples of the electronic control parts include various types of actuators and sensors.

The connector device 1 can be used as, for example, a module of an electrical braking system such as an Electro Mechanical Brake (EMB) or an Electronic Parking Brake (EPB), or a control unit such as a Fuel Injection Engine Control Unit (FI-ECU).

The connector device 1 of the present embodiment is of a molded-type in which the circuit board 2 is covered with the molded resin 5 made of a thermoplastic resin. Also, the connector device 1 does not include a cover (case) made of a resin or the like that houses the circuit board 2, and a waterproof sealing material. The molded resin 5 that covers entire circuit board 2 and part of the housing 31 of the connector 3 serves as an outermost cover that is exposed to air. The molded resin 5 is provided in place of a cover and a sealing material, and protects the circuit board 2 and terminals 35 of the connector 3 from water contained in the air. As a result of using the molded resin 5 in place of a cover and a sealing material, it is possible to downsize the connector device 1.

Circuit Board 2

Figure 5:
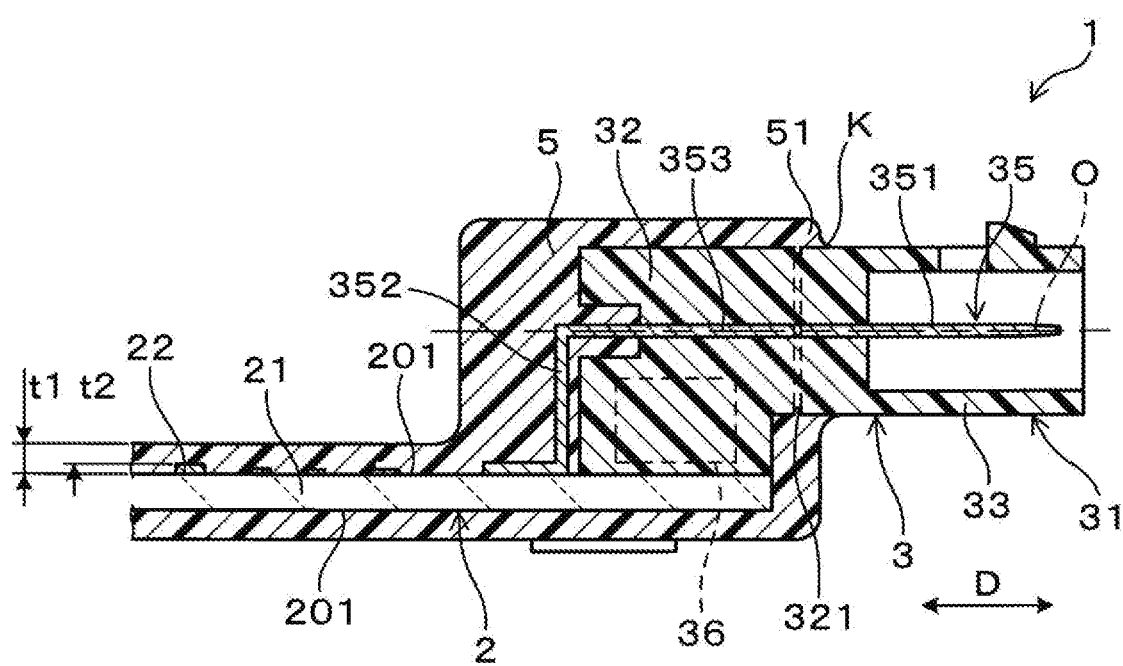
FIG. 5 is a partially enlarged cross-sectional view of FIG. 3 according to the embodiment.

As shown in FIGS. 3 and 5, the circuit board 2 includes a planar substrate portion 21 made of an insulating base material such as glass or resin on which a conductor carrying electricity is formed, and electric components 22 such as a semiconductor, a resistor, a capacitor, a coil, and a switch that are provided on the substrate portion 21 so as to be electrically connected to the conductor of the substrate portion 21. It is assumed that the electric components 22 also include an electronic component made of a semiconductor or the like. The connector 3 is attached to the vicinity of one side of the planar substrate portion 21, which includes rectangular plates 201. Here, the plates 201 refer to a pair of surfaces of the planar circuit board 2 that have the largest area. Furthermore, the rectangular plates encompass plates with chamfered corners, plates with curved surfaces, and the like.

The substrate portion 21 may also have, instead of a rectangular plate shape, a plate shape obtained by cutting off part of a rectangular plate, or the like. For example, the substrate portion 21 may also be cut off in regions in which a later-described attaching portion 11 is to be formed.

Connector 3

As shown in FIGS. 1 to 3, the connector 3 includes the insulating housing 31 made of a thermoplastic resin, and the plurality of terminals 35 that are held by the housing 31 and are made of a conductive metal material. Examples of the plurality of terminals 35 include a control terminal for use in transmission of a control signal, and a power supply terminal to be connected to a DC power supply, a ground, or the like. The connector 3 of the present embodiment is arranged in a planar direction parallel to the plates 201 of the circuit board 2.

The plurality of terminals 35 respectively have leading end portions 351 (leading ends) that are arranged in the planar direction of the circuit board 2. Furthermore, the plurality of terminals 35 respectively have base portions (base end portions) 352 that are connected to the conductor of the substrate portion 21 and are arranged while being bent from the state of being parallel to the planar direction of the substrate portion 21 to the state of being perpendicular to the planar direction of the substrate portion 21.

Figure 4:
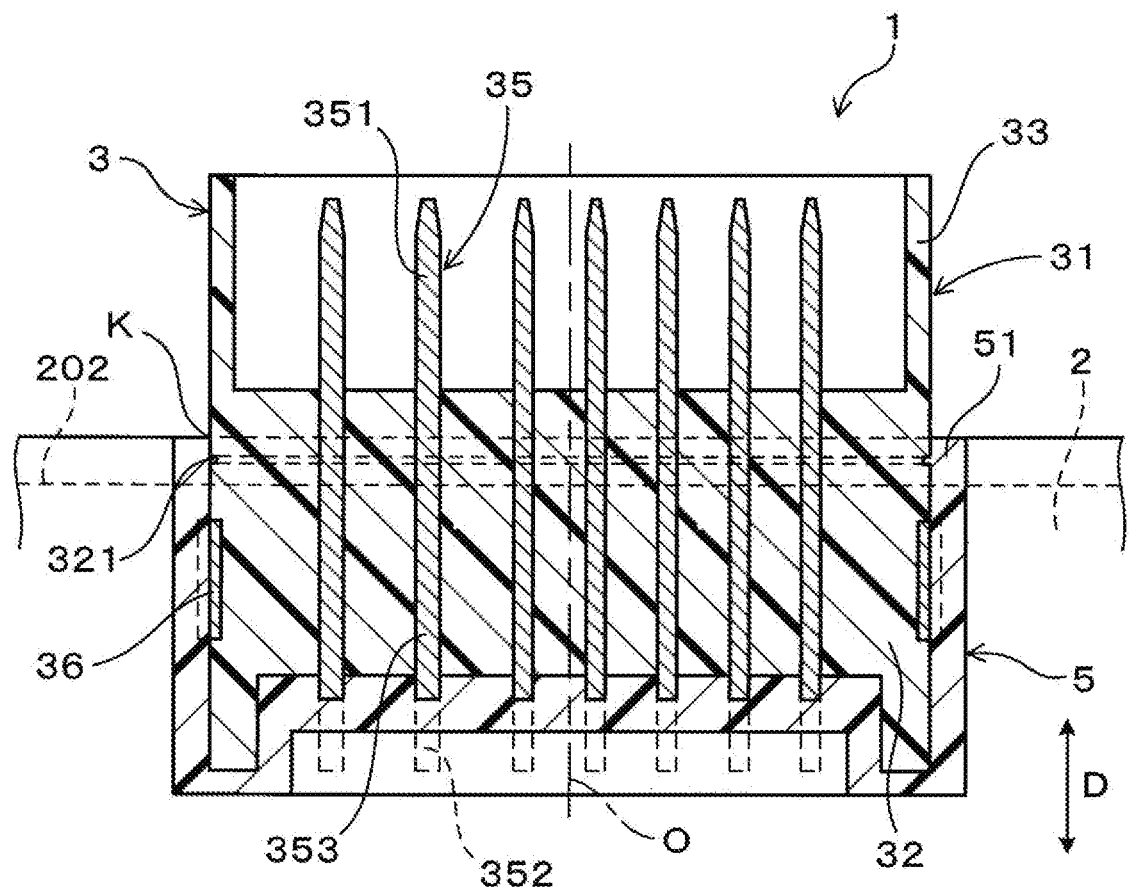
FIG. 4 is an enlarged view of a cross-sectional view taken along a line Iv-Iv in FIG. 3 according to the embodiment.

In other words, as shown in FIGS. 4 and 5, the plurality of terminals 35 are bent in a crank shape so as to take the state of being parallel to the planar direction of the substrate portion 21, the state of being perpendicular to the planar direction, and the state of being parallel to the planar direction. The housing 31 of the connector 3 includes a holding portion 32 that holds intermediate portions 353 of the plurality of terminals 35, and a hood portion (mounting portion) 33 that is tubular and encloses the leading end portions 351 of the plurality of terminals 35 and to which the counterpart connector 62 is to be mounted.

Most of the holding portion 32 of the housing 31 faces the circuit board 2, and is covered, together with the circuit board 2, with the molded resin 5. The hood portion 33 of the housing 31 protrudes from an edge face 202 of the circuit board 2, and is not covered with the molded resin 5. An end of an interface K between the housing 31 and the molded resin 5, that is to say, a leading end portion 51 of the molded resin 5 is located in the holding portion 32 of the housing 31. The connector 3 constitutes a male connector, and the plurality of terminals 35 of the connector 3 constitute male terminals. The leading end portions 351 of the plurality of terminals 35 that protrude from the holding portion 32 of the hood portion 33 are to be electrically connected to female terminals of the counterpart connector 62 serving as a female connector.

As shown in FIGS. 4 and 5, the base portions 352 of the plurality of terminals 35 protrude from the holding portion 32 of the housing 31, and are connected, through soldering, to the conductor of the substrate portion 21 of the circuit board 2. The holding portion 32 of the housing 31 includes, in addition to the plurality of terminals 35, pegs (metal parts) 36 for fixing the housing 31 to the circuit board 2. Parts of the pegs 36 are connected, through soldering, to the conductor of the substrate portion 21 of the circuit board 2. Thus, the housing 31 is fixed to the circuit board 2 by the base portions 352 of the plurality of terminals 35 and the parts of the pegs 36.

The base portions 352 of the plurality of terminals 35 are arranged outside of the holding portion 32, and are covered with the molded resin 5. Also, parts of the pegs 36 are arranged outside of the holding portion 32, and are covered with the molded resin 5.

Figure 6:
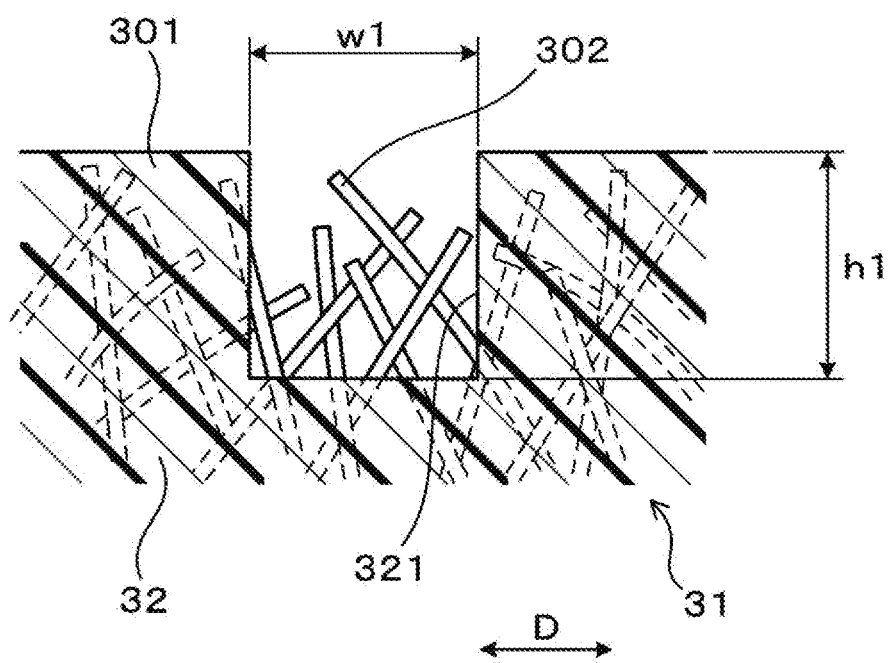
FIG. 6 is a cross-sectional view illustrating a groove portion formed in a housing of a connector before being filled with a molded resin, according to the embodiment.
Figure 7:
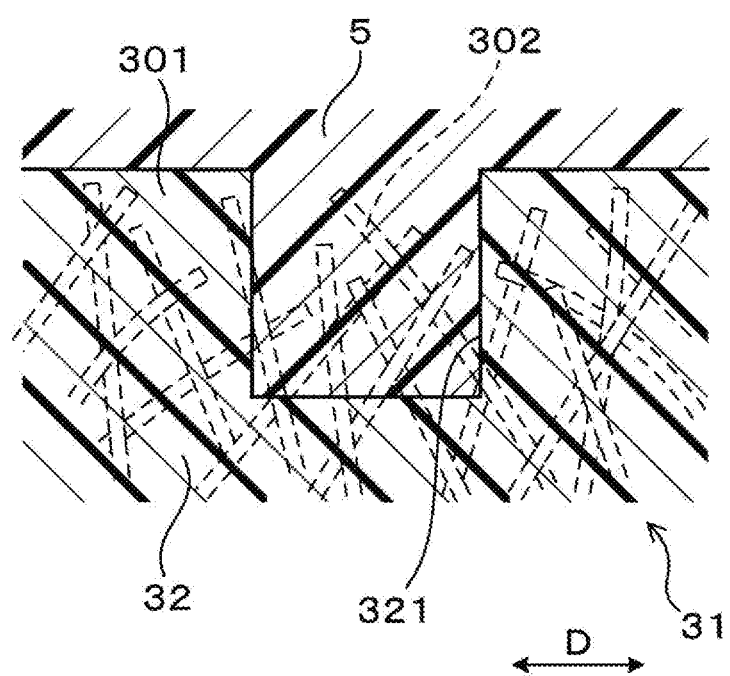
FIG. 7 is a cross-sectional view illustrating the groove portion formed in the housing of the connector after having been filled with a molded resin, according to the embodiment.

As shown in FIGS. 6 and 7, the housing 31 contains a liquid crystal polymer serving as the resin material 301, and glass fibers serving as the fibrous inorganic fillers 302. Using glass fibers for the inorganic fillers 302 can make the inorganic fillers 302 likely to remain in the groove portion 321 when the groove portion 321 is formed. "Fibrous" refers to the state of being elongated in the shape of strings, and may be paraphrased as "elongated".

The glass fibers are assumed to be fibers having a diameter in a range of 5 to 20 µm. The length of the glass fibers may be set to be five times as long as the diameter thereof, or more. The length of the glass fibers may also be set to be larger than the depth h1 and the width w1 of the groove portion 321 formed in the housing 31, so that the glass fibers are less likely to be removed from the groove portion 321 of the housing 31. It is conceivable that the glass fibers becomes shorter in the length in the course of molding the housing 31.

The inorganic fillers 302 are distributed in the resin material 301 as uniform as possible. A plurality of inorganic fillers 302, out of the inorganic fillers 302, are arranged while being directed in different directions. The inorganic fillers 302 may also be inorganic fibers other than glass fibers, as long as they do not melt when being irradiated with laser beams but remain in the groove portion 321 formed by removing the resin material 301 using laser beams.

The liquid crystal polymer has the property such that linear chains of molecules are regularly aligned in the melted state thereof. The liquid crystal polymer constitutes an aromatic polyester series resin, and may also be referred to as "liquid crystalline polyester". The liquid crystal polymer is a crystalline thermoplastic resin.

The housing 31 is formed by performing insert molding of inserting a resin material for a liquid crystal polymer containing glass fibers into a mold die in which the plurality of terminals 35 and the plurality of pegs 36 are arranged. In the housing 31, the end portions 351 and 352 of the plurality of terminals 35, and parts of the pegs 36 are exposed.

By using a liquid crystal polymer as the resin material 301 for the housing 31, and using a polyamide resin for the molded resin 5, the housing 31 and the molded resin 5 are intimately attached to each other, making it possible to effectively prevent water from entering the connector device 1 from the interface K between the housing 31 and the molded resin 5.

Note that, instead of a liquid crystal polymer, a poly phenylene sulfide resin may also be used as the resin material 301 for the housing 31. Also, in this case, the same effects as those in the cases where a liquid crystal polymer is used can be obtained. A poly phenylene sulfide resin is a resin whose molecular structure is such that phenyl groups (benzene rings) and sulfur (S) are connected to each other alternately and repeatedly. A poly phenylene sulfide resin is a crystalline thermoplastic resin.

The connector 3 may also be arranged in a direction perpendicular to the planar direction of the plates 201 of the circuit board 2. In this case, the leading end portions 351 of the plurality of terminals 35 are arranged in a direction perpendicular to the planar direction of the circuit board 2.

Molded Resin 5

As shown in FIGS. 1 to 3, the molded resin 5 is formed through molding such that the circuit board 2 and the connector 3 are arranged in the mold die, the mold die is filled with a melted resin material for forming the molded resin 5, and the resin material is solidified. This molding method is also referred to as hot melt molding, and is a molding method in which a melted resin material is poured into a mold die at low pressure to form the molded resin 5 in the mold die. As a result of hot melt molding, it is possible to form the molded resin 5 at low temperature and low pressure, and thus no adverse effects due to the temperature and the pressure occur in the electric components 22 attached to the circuit board 2, serving as an insert component.

As shown in FIG. 1, the molded resin 5 can be formed through molding at low pressure and low temperature, and thus the formation is easy. The molded resin 5 has a gate mark 52 that indicates that it is formed through molding. The gate mark 52 is a mark obtained when the resin material remains in a gate, which is formed in the mold die and is an entrance for the resin material, and the remaining resin material is cut from the molded resin 5 serving as a product. As a result of the molded resin 5 having the gate mark 52, it is possible to confirm that the molded resin 5 is formed by molding.

As shown in FIG. 5, the molded resin 5 covers the entire circuit board 2 including the electric components 22, and the holding portion 32 of the housing 31 of the connector 3, the base portions 352 of the plurality of terminals 35, and parts of the pegs 36. The molded resin 5 has a thickness as uniform as possible over the plates 201 of the circuit board 2 and the surface of the holding portion 32 of the housing 31 of the connector 3. The region of the molded resin 5 that faces the plates 201 of the circuit board 2 has thicknesses t1 and t2 in a range from 1 mm to 5 mm inclusive. If the thicknesses t1 and t2 of the molded resin 5 are less than 1 mm, the molded resin 5 will not have sufficient strength, and if the thicknesses t1 and t2 of the molded resin 5 exceed 5 mm, an excessive amount of the resin material will be consumed.

As shown in FIG. 5, a plate 201 of the substrate portion 21 of the circuit board 2 has a convex region in which the electric components 22 are arranged. The surface of the molded resin 5 that is arranged on the plate 201 of the substrate portion 21 of the circuit board 2 may be flat. In this case, the thickness t2 of the molded resin 5 in the region of the substrate portion 21 in which an electric component 22 is arranged is less than the thickness t1 of the molded resin 5 in the region of the substrate portion 21 in which no electric component 22 is arranged.

Figure 8:
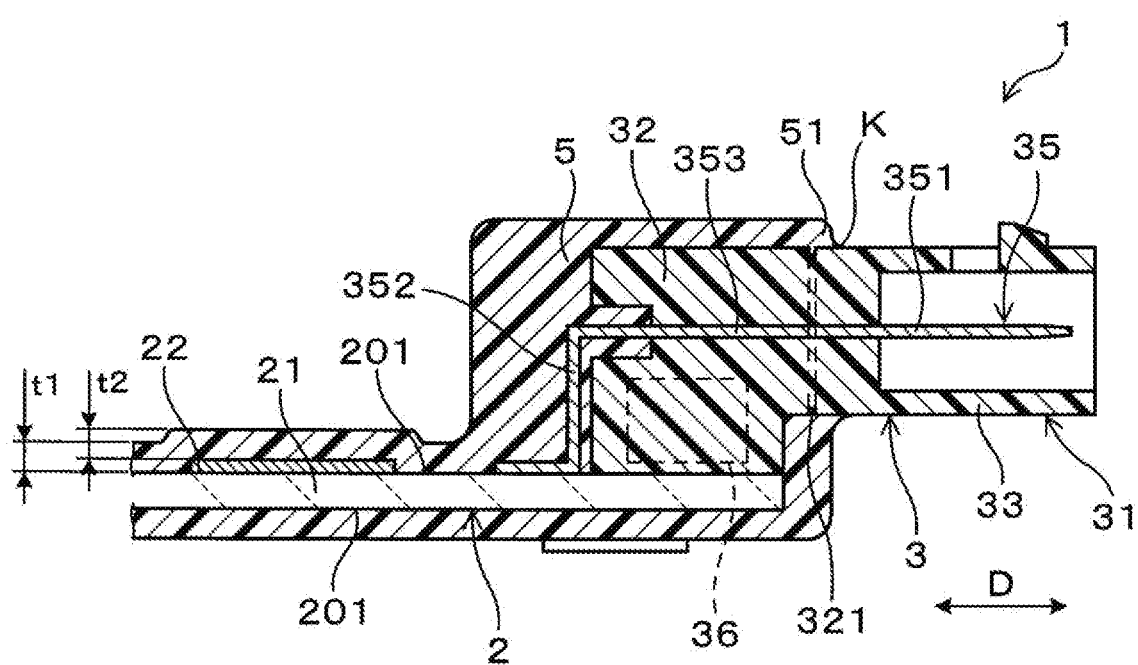
FIG. 8 is a cross-sectional view of another connector device according to the embodiment, the cross-sectional view corresponding to FIG. 5.

Also, as shown in FIG. 8, the thickness t2 of a first molded resin 5A in the region of the substrate portion 21 in which an electric component 22 is arranged may also be set to be equal to the thickness t1 of the first molded resin 5A in the region of the substrate portion 21 in which no electric component 22 is arranged. In this case, the molded resin 5 in the region of the substrate portion 21 in which the electric component 22 is arranged will protrude in a convex shape from the molded resin 5 in the region of the substrate portion 21 in which no electric component 22 is arranged.

As shown in FIGS. 4 and 5, if it is assumed that the direction in which the leading end portions 351 of the plurality of terminals 35 extend and the hood portion 33 is formed is set to a mounting direction D in which the counterpart connector 62 is to be mounted, the molded resin 5 will be provided over the entire periphery of the holding portion 32 of the housing 31 of the connector 3 around the central axis line O of the hood portion 33 and the holding portion 32, the central axis line O extending in the mounting direction D. Here, "central axis line O" refers to a virtual line that extends through the centers of the cross sections of the hood portion 33 and the holding portion 32 that are orthogonal to the mounting direction D. The thickness of the molded resin 5 in the region that faces the surface of the housing 31 of the connector 3 is in the range from 1 mm to 5 mm inclusive.

The molded resin 5 of the present embodiment is made of a polyamide resin whose melting point or softening point is 190° C. Here, "melting point" refers to a transition temperature at which a solid material transitions to liquid by being heated. Furthermore, "softening point" refers to a temperature at which resin is softened, and that is defined according to the ring-and-ball method in compliance with JIS K6863. When the molded resin 5 is molded, a polyamide resin material is heated to a temperature in a range from 190° C.

to 230° C. inclusive, and the mold die is filled with the heated resin material. Also, the polyamide resin material that has filled up the mold die is cooled and solidified, so that the molded resin 5 is formed.

When the molded resin 5 is molded, a resin material whose melting point or softening point is 230° C. or less is used for the molded resin 5, so as to prevent a conductive material such as solder that connects the conductor of the substrate portion 21 of the circuit board 2 and the terminal 35 of the connector 3 from melting.

Attaching Portion 11

As shown in FIGS. 1 and 2, the molded resin 5 includes the attaching portion 11 for attaching the connector device 1 to the external machine part 61 or the like. The attaching portion 11 has a metal collar 4 through which a bolt 42 is inserted. The attaching portion 11 of the present embodiment is constituted by a plurality of collars 4. Each collar 4 is cylindrical, and has a central hole through which a bolt 42 is inserted. The two end portions of the collar 4 protrude from the surfaces of the molded resin 5. The bolt 42 inserted into the collar 4 is screwed into a screw hole formed in the machine part 61 or the like.

The collar 4 may have, on its outer circumference 41, a flange portion that protrudes toward the outer circumference to prevent the collar 4 from disengaging from the molded resin 5. Flange portions may also be formed at a plurality of positions in the axial direction of the collar 4.

The attaching portion 11 includes four collars 4 that are arranged in the vicinity of the four corners of the circuit board 2 in the shape of a rectangular plate. In the vicinity of the region of the circuit board 2 in which each collar 4 is arranged, there may also be a notch for avoiding interference with the collar 4.

Groove Portion 321 of Housing 31 and Molded Resin 5 Inside Groove Portion 321

As shown in FIGS. 4 and 5, the groove portion 321 formed in the housing 31 of the connector 3, and the molded resin 5 located inside the groove portion 321 have shapes that prevent water from entering the connector device 1 from the leading end portion 51 of the molded resin 5. The leading end portion 51 of the region of the molded resin 5 that covers the housing 31 is located in a direction orthogonal to the central axis line O of the housing 31, the central axis line O extending through the center of the connector 3 and in parallel to the mounting direction D in which the counterpart connector 62 is to be mounted.

Furthermore, the leading end portion 51 of the molded resin 5 is arranged on the entire periphery around the central axis line O of the holding portion 32 of the housing 31. The leading end portion 51 of the molded resin 5 is a region that forms the interface K between the housing 31 and the molded resin 5, and in which water may enter the inside of the connector device 1 from the outside.

The groove portion 321 is formed in the region of the holding portion 32 of the housing 31 that is located on the base side of the leading end portion 51 of the molded resin 5, extending over the entire periphery around the central axis line O and in parallel to the leading end portion 51. In other words, one groove portion 321 is formed in the holding portion 32 of the housing 31 in the shape of a ring around the central axis line O. "The base side in the housing 31" refers to the side toward the center of the circuit board 2.

As shown in FIGS. 6 and 7, the cross section that is orthogonal to the direction in which the groove portion 321 of the present embodiment is formed has a square shape or the shape with a curved bottom. The depth h1 of the groove portion 321 can be set to have the largest depth of the groove portion 321. In this case, it is sufficient that the largest depth of the groove portion 321 is in the range from 50 μm and 150 μm inclusive. The depth h1 and the width w1 of the groove portion 321 may be substantially uniform over the entire periphery of the groove portion 321.

FIG. 6 is an enlarged view of the groove portion 321 before being filled with the molded resin 5, and FIG. 7 is an enlarged view of the groove portion 321 after having being filled with the molded resin 5. As shown in the figures, the groove portion 321 is formed as a result of the resin material 301 of the housing 31 being irradiated with laser beams and removed. In the groove portion 321, the inorganic fillers 302 that remain in the groove portion 321 after the resin material 301 has been removed are arranged. Also, part of the molded resin 5 that is arranged on the surface of the housing 31 is arranged in the groove portion 321 continuously from the surface of the housing 31. Also, part of the molded resin 5 is arranged in the groove portion 321 in a state in which the inorganic fillers 302 are embedded.

The depth h1 and the width w1 of the groove portion 321 of the present embodiment that is formed using laser beams emitted by a laser emitting device are in the range from 50 μm to 150 μm inclusive. The groove portion 321 is formed by emitting laser beams onto the surface of the holding portion 32 of the housing 31 and moving the laser beams. At that time, a constant speed at which the laser beams are moved is set, so that the depth h1 and the width w1 of the groove portion 321 are constant.

The areal contact between the housing 31 and the molded resin 5 is the largest in the groove portion 321, as a result of part of the molded resin 5 being caught on the inorganic fillers 302 in the groove portion 321 due to the anchor effect. Accordingly, it is extremely difficult for water to enter the interface K between the part of the housing 31 that forms the groove portion 321 and the part of the molded resin 5.

Figure 9:
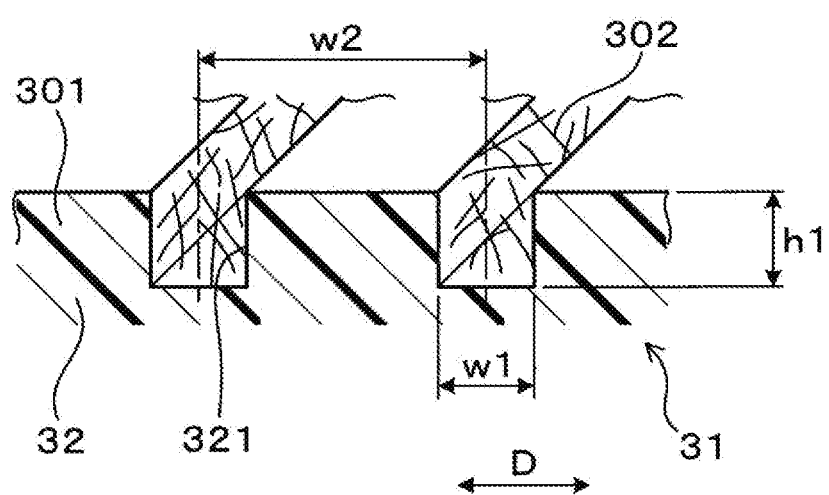
FIG. 9 is a cross-sectional view illustrating part of the housing of the connector in which a plurality of groove portions are formed, according to the embodiment.

As shown in FIG. 9, a plurality of groove portions 321 may also be formed in parallel to the leading end portion 51 of the molded resin 5. FIG. 9 shows the vicinity of the surface of the housing 31 before the molded resin 5 is provided. In this case, a plurality of annular groove portions 321 that are parallel to each other will be formed around the central axis line O of the holding portion 32 of the housing 31. Furthermore, in this case, it is possible to more effectively prevent water from entering the connector device 1 from the leading end portion 51 of the molded resin 5.

Method for Manufacturing Connector Device 1

When the connector device 1 is manufactured, first, insert molding, serving as injection molding, is performed for the housing 31 in which the plurality of terminals 35 and the plurality of pegs 36 are inserted, thereby forming the connector 3. At this time, the resin material 301 that contains multiple distributed glass fibers serving as the inorganic fillers 302 is used as the material for forming the housing 31.

Then, the surface of the holding portion 32 of the connector 3 extending over the entire periphery around the central axis line O is irradiated with laser beams. At this time, the resin material 301 in the region of the surface of the holding portion 32 that is irradiated with the laser beams is melted, and is removed from the surface of the holding portion 32. Then, as shown in FIG. 6, the groove portion 321 in the shape of a depression is formed in the region with the resin material 301 removed. Furthermore, the inorganic fillers 302 contained in the resin material 301 are exposed in the groove portion 321.

Figure 10:
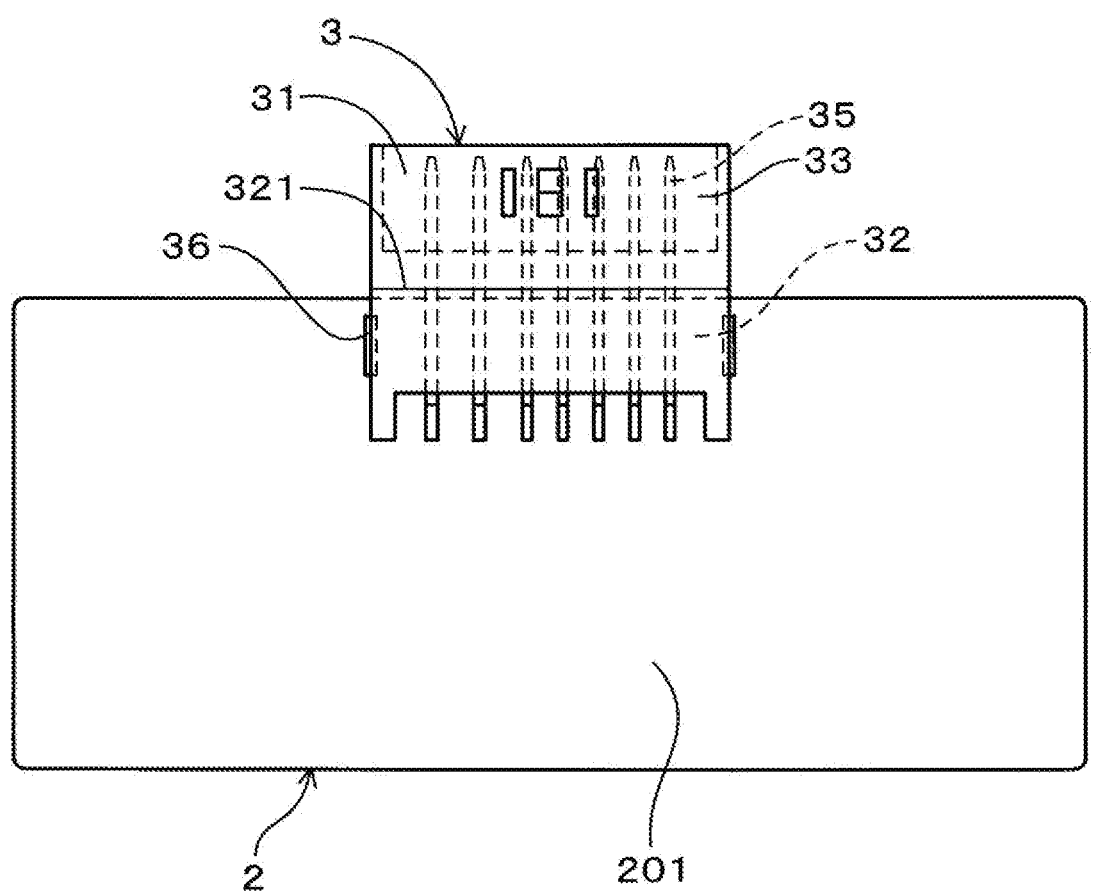
FIG. 10 is a plan view illustrating a circuit board and the connector of the connector device according to the embodiment.

Furthermore, the circuit board 2 on which various electric components 22 are arranged is formed. Then, as shown in FIG. 10, the connector 3 is arranged on the circuit board 2, and the plurality of terminals 35 and the plurality of pegs 36 of the connector 3 are connected, through soldering, to the conductor of the substrate portion 21. FIG. 10 shows the circuit board 2 on which the connector 3 is arranged, that is, FIG. 10 shows the connector device 1 before the molded resin 5 is provided.

Then, as shown in FIGS. 1 to 5, insert molding, namely, hot melt molding is performed for the molded resin 5 in which the plurality of collars 4 and the circuit board 2 on which the connector 3 is mounted are inserted, thereby manufacturing the connector device 1. Accordingly, the entire circuit board 2, the holding portion 32 of the housing 31 of the connector 3, the base portions 352 of the plurality of terminals 35, the plurality of pegs 36, and the outer circumferences 41 of the plurality of collars 4 are embedded in the molded resin 5. Furthermore, the soldered portions between the base portions 352 of the plurality of terminals 35 and the plurality of pegs 36, and the conductor of the substrate portion 21 of the circuit board 2 are also embedded in the molded resin 5.

Part of the molded resin 5 arranged on the outer periphery of the holding portion 32 of the housing 31 is continuously arranged in the groove portion 321. Furthermore, the hood portion 33 of the housing 31 and the leading end portions 351 of the plurality of terminals 35 are exposed to the outside of the molded resin 5. Furthermore, the polyamide resin of which the molded resin 5 is made comes into areal contact with the liquid crystal polymer of which the housing 31 of the connector 3 is made, so that the interface K between the molded resin 5 and the housing 31 is sealed.

Functional Effects

Since, in the connector device 1, the entire circuit board 2 is covered with the molded resin 5, the molded resin 5 can protect the circuit board 2 from water flying in all directions in the air. Also, the interface K between the housing 31 of the connector 3 and the molded resin 5 is located on the surface of the connector device 1. This interface K is a region of the connector device 1 that needs a countermeasure against water the most.

The surface of the holding portion 32 of the housing 31 of the connector 3 has the groove portion 321 that extends in a direction that intersects the mounting direction D in which the counterpart connector 62 is to be mounted. The inorganic fillers 302 remains in this groove portion 321. Also, in the state in which the groove portion 321 is filled with part of the molded resin 5 arranged on the surface of the holding portion 32 of the housing 31, the anchor effect can be achieved such that part of the molded resin 5 is less likely to be removed due to being caught on the inorganic fillers 302 in the groove portion 321.

Accordingly, the degree of areal contact or adhesion strength between the housing 31 and the molded resin 5 increases, so that the housing 31 and the molded resin 5 at the interface K are less likely to be uncoupled. Therefore, the waterproofing performance between the housing 31 of the connector 3 and the molded resin 5 can be improved, making it possible to prevent water from entering the connector device 1 from the interface K between the housing 31 of the connector 3 and the molded resin 5.

Also, in the connector device 1 of the present embodiment, a polyamide resin whose melting point or softening point is less than 230° C. is used for the molded resin 5, and a liquid crystal polymer or a poly phenylene sulfide resin is used for the housing 31 of the connector 3. The combination of the polyamide resin and the liquid crystal polymer or the poly phenylene sulfide resin can improve the waterproofing performance between the housing 31 of the connector 3 and the molded resin 5. Also, it is possible to prevent water from entering the connector device 1 from the interface K between the housing 31 of the connector 3 and the molded resin 5.

Through the research and development by the inventors of the present application, it turned out that the areal contact between a polyamide resin and a liquid crystal polymer or a poly phenylene sulfide resin is especially superior. It was found for the first time through the research and development by the inventors of the present application that the combination of these resin materials increases the waterproofing performance (sealing properties and water stopping properties) at the interface K between the materials.

The reason why the waterproofing performance at the interface K is improved may be because an amide bond in the polyamide resin binds to a polar group in the liquid crystal polymer or a polar group in the poly phenylene sulfide resin, which increases the degree of areal contact between the housing 31 of the connector 3 and the molded resin 5.

Thus, according to the connector device 1 of the present embodiment, it is possible to improve the waterproofing performance between the housing 31 of the connector 3 and the molded resin 5.

Check Test

Figure 11:
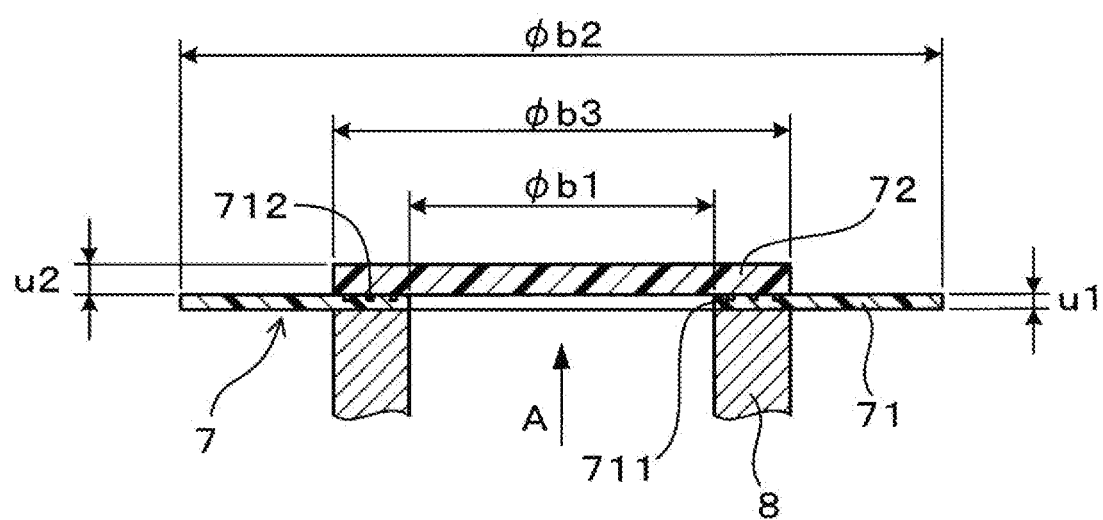
FIG. 11 is a cross-sectional view illustrating a test sample for use in a check test.

In a check test, the airtightness between the housing 31 of the connector 3 and the molded resin 5 was checked. As shown in FIG. 11, in this check test, a test sample 7 that includes a first resin portion 71 that imitates the housing 31 and a second resin portion 72 that imitates the molded resin 5 was prepared. The first resin portion 71 of the test sample 7 is a cylindrical plate that has an inner diameter $\varphi b1$ of $\varphi 20$ mm, an outer diameter $\varphi b2$ of $\varphi 50$ mm, and a thickness u1 of 1 mm. The second resin portion 72 of the test sample 7 is a circular disc that has a diameter $\varphi b3$ of $\varphi 30$ mm, and a thickness u2 of 2 mm. Also, the first resin portion 71 and the second resin portion 72 are concentrically attached to each other, and the first resin portion 71 and the second resin portion 72 are brought into areal contact with each other when the second resin portion 72 is molded.

Also, test samples 1 to 6 were prepared, in each of which one or more annular groove portions 712 are formed in the surface of a first resin portion 71 that faces a second resin portion 72, while extending around a center hole 711 of the first resin portion 71. The groove portion 712 was formed with a depth h1 of 100 μm and a width w1 of 100 μm. Also, if a plurality of groove portions 712 were formed, a center-to-center distance w2 in the width direction of the groove portion 712 was set to 300 μm. This center-to-center distance w2 serves as a pitch when laser beams are emitted thereto. The test sample 7, which serves as a comparison target, does not have a groove portion 712.

The first resin portions 71 of the test samples 1 to 3 that imitate the housing 31 of the connector 3 are made of a liquid crystal polymer (LCP) that contains glass fibers. The first resin portions 71 of the test samples 4 to 6 are made of a poly phenylene sulfide resin (PPS) that contains glass fibers. Also, the second resin portions 72 of the test samples 1 to 6 that imitate the molded resin 5 are made of a polyamide resin (PA) whose softening point is 190° C.

One annular groove portion 712 was formed in the first resin portions 71 of the test samples 1 and 4, three annular groove portions 712 were formed in the first resin portions 71 of the test samples 2 and 5, and five annular groove portions 712 were formed in the first resin portions 71 of the test samples 3 and 6. On the other hand, the first resin portion 71 of the test sample 7 was made of a liquid crystal polymer, and the second resin portion 72 of the test sample 7 was made of polyester (PEs). Furthermore, no groove portion 712 was formed in the first resin portion 71 of the test sample 7.

The first resin portions 71 of the test samples 1 to 7 were formed through injection molding, and the second resin portions 72 thereof were formed through hot melt molding. The hot melt molding was performed at a molding temperature of 210° C.

In the check test, an air tube 8 for supplying air A was connected to the center hole 711 of each first resin portion 71, the pressure of the air A that flows through the air tube 8 was changed in a range from 200 to 500 kPa, and it was checked whether or not a leakage (air leak) of the air A occurred between the first resin portion 71 and the corresponding second resin portion 72. Also, a pressure was applied, using the air A, to the center hole 711 of each first resin portion 71 for 30 seconds at a pressure of 200 to 500 kPa. The application of pressure using the air A was performed at an ambient temperature (25° C.). Results of the check as to whether or not there is a leakage of the air A with respect to the test samples 1 to 7 are shown in a table 1.

TABLE 1

| | | 1 | 2 | 3 | 4 | 5 | 6 | 7 |
|---|---|---|---|---|---|---|---|---|
| Test samples | First resin portion (connector) | LCP | LCP | LCP | PPS | PPS | PPS | LCP |
| | Second resin portion (molded resin) | PA | PA | PA | PA | PA | PA | PEs |
| | The number of grooves | 1 | 3 | 5 | 1 | 3 | 5 | 0 |
| Applied pressure | 200[kPa] | good | good | good | good | good | good | good |
| | 300[kPa] | good | good | good | good | good | good | poor |
| | 400[kPa] | good | good | good | good | good | good | — |
| | 500[kPa] | poor | good | good | poor | good | good | — |

In the evaluation results shown in Table 1, when the pressure of the air A had not decreased after the application of pressure using the air A, "good" was entered meaning that no leakage of the air A occurred between the first resin portion 71 and the second resin portion 72. On the other hand, when the pressure of the air A had decreased after the application of pressure using the air A, "poor" was entered meaning that a leakage of the air A occurred between the first resin portion 71 and the second resin portion 72.

It was confirmed that, in the test samples 1 and 4, no leakage of the air A had occurred when the pressure of the air A was 400 kPa or less. Furthermore, it was confirmed that, in the test samples 2, 3, 5, and 6, no leakage of the air A had occurred even when the pressure of the air A was 500 kPa. Also, it was found that the test samples 1 to 6 whose housings 31 have at least one groove portion 712 can have sufficient water stopping properties (sealing properties) between the housing 31 of the connector 3 and the molded resin 5 in the connector device 1.

On the other hand, it was confirmed that, in the test sample 7 whose housing 31 has no groove portion 712, a leakage of the air A had occurred when the pressure of the air A was 300 kPa or more. Also, it was found that there is a room for improvement in the water stopping properties (sealing properties) between the housing 31 of the connector 3 and the molded resin 5 of the connector device 1.

Based on these results, it was found that, with the connector device 1 in which the groove portion 321 is formed in the holding portion 32 of the housing 31 of the connector 3, and part of the molded resin 5 is arranged in the groove portion 321 in the state in which the glass fibers serving as the inorganic fillers 302 are embedded, the waterproofing performance between the housing 31 and the molded resin 5 can be improved.

The present disclosure is not limited only to the embodiment, and other embodiments may also be configured without departing from the spirit thereof. Furthermore, the present disclosure encompasses various modifications, modifications within the equivalent scope, and the like. Furthermore, the technical idea of the present disclosure includes various combinations of the constituent components envisaged from the present disclosure, aspects, and the like.

What is claimed is:

1. A connector device comprising: a circuit board; a connector attached to the circuit board; and a molded resin that covers the entire circuit board and part of the connector and including an attaching portion that is used to attach the connector device to an external device, wherein: a housing of the connector contains a resin material and fibrous inorganic fillers, a groove is formed in a region of a surface of the housing that is covered with the molded resin, the groove being formed by removing the resin material with the inorganic fillers remaining, and extending in a direction that intersects a mounting direction in which a counterpart connector is to be mounted to the connector, the groove has a depth and a width in a range from 50 pm to 150 pm inclusive, and the groove is filled with the molded resin, wherein: a leading end of a region of the molded resin that covers the housing is arranged in a direction orthogonal to a central axis line of the housing that is parallel to the mounting direction and extends through a center of the connector, and the groove is formed in a region of the housing on a base side of the leading end of the molded resin, the groove being formed in parallel to the leading end.

2. The connector device according to claim 1, wherein:
the leading end of the molded resin is arranged over an entire periphery around the central axis line of the housing, and
the groove is formed in the region of the housing on a base side of the leading end of the molded resin, the groove being formed over the entire periphery around the central axis line.

3. The connector device according to claim 1,
wherein one or more grooves are formed in parallel to the leading end of the molded resin.

4. The connector device according to claim 1, wherein:
the inorganic fillers are made of glass fibers, and
a plurality of inorganic fillers, out of the inorganic fillers arranged in the groove, are directed in different directions.

5. The connector device according to claim 1,
wherein the molded resin has a gate mark that indicates that the molded resin is formed through molding.

6. The connector device according to claim 1,
wherein a region of the molded resin that faces a plate of the circuit board has a thickness in a range from 1 mm to 5 mm inclusive.

7. The connector device according to claim 1,
wherein the connector device is used as an on-board control unit.

* * * * *